United States Patent [19]

Patron et al.

[11] Patent Number: 5,111,024

[45] Date of Patent: May 5, 1992

[54] HIGH-FREQUENCY HIGH-VOLTAGE POWER GENERATOR WITH A COAX RESONATOR

[75] Inventors: Christian S. A. E. Patron; Theodorus H. J. Walters, both of Eindhoven, Netherlands

[73] Assignee: U.S. Philips Corporation, New York, N.Y.

[21] Appl. No.: 549,346

[22] Filed: Jul. 6, 1990

[30] Foreign Application Priority Data

Jul. 13, 1989 [NL] Netherlands .......................... 8901806

[51] Int. Cl.$^5$ ................................................ B33K 9/00
[52] U.S. Cl. ........................... 219/121.54; 219/121.57; 219/121.36; 315/111.21
[58] Field of Search ...................... 219/121.43, 121.36, 219/121.52, 121.54, 121.57, 10.77, 10.81; 315/111.51, 111.21, 111.41

[56] References Cited

U.S. PATENT DOCUMENTS

| | | | |
|---|---|---|---|
| 2,554,087 | 5/1951 | Breimer | 250/36 |
| 3,353,060 | 11/1967 | Yamamoto et al. | 315/111.51 |
| 3,721,920 | 3/1973 | Mann | 219/10.77 |
| 4,473,736 | 9/1984 | Bloyet et al. | 219/121.52 |

*Primary Examiner*—Mark H. Paschall
*Attorney, Agent, or Firm*—Bernard Franzblau

[57] ABSTRACT

In order to operate high-frequency heating equipment such as, for example, plasma torches, it is desirable to provide a power generator which will generate a high-frequency high voltage providing a large amount of power. If an oscillator circuit includes an electron tube (1), a control circuit (7) and a frequency-determining circuit that is formed by a coaxial waveguide (11) which is biased in the neighborhood of its short-circuited end a high-frequency high voltage will be obtained at the open end of the waveguide. The power supplied by the electron tube is stepped up to the permissible maximum value for given maximum supply voltage by having the electron tube generate the corresponding current, which is determined by the choice of the point (14) at which the coaxial waveguide (11) is biased.

19 Claims, 1 Drawing Sheet

HIGH-FREQUENCY HIGH-VOLTAGE POWER GENERATOR WITH A COAX RESONATOR

BACKGROUND OF THE INVENTION

This invention relates to a power generator for supplying a high-frequency high-voltage, comprising an active element, a frequency-determining circuit connected in series to the AC main current path of the active element and a control circuit connected to a control electrode of the active element.

Such a power generator is known from Dutch Patent Specification No. 67258 (U.S. Pat. No. 2,554,087).

For operating high-frequency heating equipment for industrial applications such as, for example, plasma torches, it is deemed desirable to generate a high-frequency high-voltage having a large power.

From said Dutch Patent Specification No. 67258 a power generator is known for inductively heating a workpiece. This workpiece causes appreciable damping of the frequency-determining circuit, which implies that the resonance resistance of the frequency-determining circuit has a low value. In order to attain a reasonable efficiency of the power generator, the impedance of the frequency-determining circuit is stepped up. As a result, the AC output voltage of the active element is stepped down, whereas many high-frequency heating processes actually require a high AC output voltage.

In the power generator said Dutch Patent Specification No. 67258 the maximum attainable operating frequency is restricted by the presence of parasitic reactances. For example, in parallel with the induction coil in the frequency-determining circuit there is always a relatively large parasitic capacitance. This capacitance limits the maximum attainable operating frequency.

It is likewise desirable to protect the active element from overload failure at a given maximum supply voltage.

SUMMARY OF THE INVENTION

It is an object of the invention to provide a power generator able to supply a high-frequency high-voltage having a large power in which the current supplied by the active element is adjustable at a given maximum supply voltage.

For this purpose, the power generator according to the invention is characterised in that the frequency-determining circuit is arranged in the form of a coaxial waveguide having an electrical length of a quarter of the wavelength of the operating frequency, one end of the waveguide being short-circuited and the other end being open and whose connection points to the AC main current path are situated in the neighbourhood of the short-circuited end, and in wherein at least one connection point is located at an adjustable position.

The amplitude of the voltage across a coaxial waveguide closed at one end and open at the other presents a sinusoidal voltage variation along the waveguide. Since one end of this waveguide is short-circuited and the other end is open, the amplitude of the voltage at the open end reaches a maximum. If the connection points to the AC main current path are situated in the neighbourhood of the short-circuited end, the AC output voltage of the active element in a loaded condition can be stepped up by a factor of 5 in a practical embodiment of the invention.

In the above structure the coaxial waveguide has a two-fold function: it steps up the AC output voltage of the active element and through its electrical length determines the operating frequency.

Because the locations of the connections points to the AC main current path are adjustable, the current supplied by the active element to the coaxial waveguide at a given maximum supply voltage becomes adjustable too.

The active element is able to supply a specific maximum power at a given maximum supply voltage. If more power is required, the active element will fail because the current becomes too large and the active element will become overloaded. By restricting this current, a failure of the active element with a given supply voltage is avoided. Since the locations of the connection points determine the step-up factor of the AC output voltage of the active element and the step-up output voltage of the coaxial waveguide with a given load determines the current, the maximum current to be supplied by the active element can be restricted to a maximum value by a relevant choice of the locations of the connection points. With the given maximum supply voltage and the given load the current will then be restricted to the maximum value. If the given load changes (in the case of a plasma torch, by choosing a different workpiece to be heated or a different gas), the locations of the connection points will have to be changed too in order to restrict the current again to the same maximum value.

So doing this avoids a breakdown of the active element as a result of an overload with a given maximum supply voltage and a given load. When the power generator is in operation (heating of the workpiece) the power can be adjusted by adjusting the supply voltage.

An embodiment of the power generator according to the invention is characterised in that the inner guide is arranged in the form of a tube open both in the neighbourhood of the short-circuited end of the coaxial waveguide and at the other end.

This embodiment renders the power generator according to the invention suitable for use as a plasma torch. The workgas necessary for this purpose can be supplied through the inner guide. In addition, it is advantageous to supply the gas in the neighbourhood of the short-circuited end, thus at a location of relatively low voltage, to the inner guide in order to avoid the chance of an high-voltage breakdown to the gas supply equipment.

BRIEF DESCRIPTION OF THE DRAWING

The invention will be further explained with reference to an exemplary embodiment represented in the accompanying drawing, in which.

DESCRIPTION OF THE PREFERRED EMBODIMENTS

Figure 1:
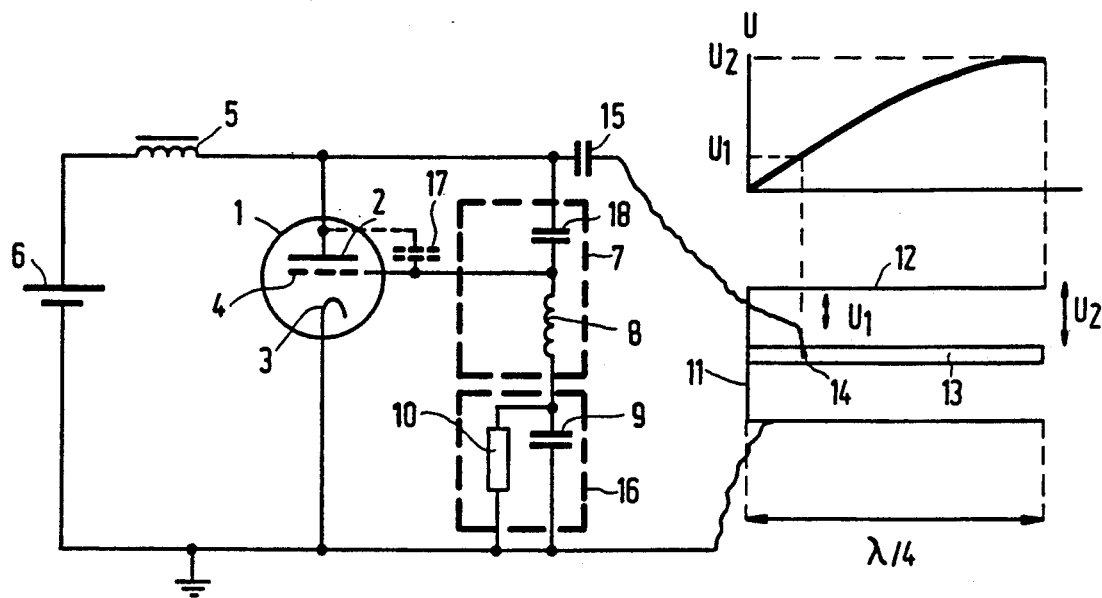
FIG. 1 shows a diagram of the power generator according to the invention, likewise representing the variation of the voltage in the coaxial waveguide.

The power generator as shown in FIG. 1 comprises an electron tube 1 having an anode 2, a cathode 3 and a control electrode 4. The anode 2 is connected to one end of a choke 5 whose other end is connected to the positive pole of a supply voltage source 6. The negative pole of this supply voltage source 6 is connected to ground as is the cathode 3 of electron tube 1.

Control circuit 7 comprises a series connection of an inductance coil 8 and a capacitor 18. The junction point of this series connection is coupled to control electrode 4. The other side of the capacitor 18 is connected to the anode 2 while the other side of the inductance coil 8 is connected to one side of auto-bias circuit 16, whose other side is connected to ground. Auto-bias circuit 16 is formed by a parallel connection of a resistor 10 and a capacitor 9.

The frequency-determining circuit is formed by a coaxial waveguide 11 having an electrical length of a quarter of the wavelength of to the operating frequency. This waveguide 11, open on one side and closed and short-circuited on the other, is constituted by an outer guide 12 and an inner guide 13. The outer guide 12 is connected to ground and in the neighbourhood of the short-circuited end the inner guide 13 is connected to one side of capacitor 15 at point 14. The other side of this capacitor 15 is connected to the anode 2.

Since the waveguide 11 may be regarded as the electrical equivalent of a parallel RLC circuit, the voltage on waveguide 11 becomes sinusoidal. This sinusoidal voltage appears at anode 2 through capacitor 15 and after a phase rotation arrives at control electrode 4 by means of a voltage-divider phase rotation network constituted by the series connection of capacitor 18, inductance coil 8 and auto-bias circuit 16. Inductance coil 8, capacitors 9, 18 and resistor 10 are dimensioned such that the sinusoidal voltage at control electrode 4 is only positive during the top of the sinewave. Consequently, control electrode 4 will only draw current for the duration of this top as a result of which electron tube 1 is conductive and non-conductive in a pulsating fashion. In this way electron tube 1 and waveguide 11 form an oscillator that oscillates at an operating frequency whose associated wavelength is equal to four times the electrical length of waveguide 11.

Auto-bias circuit 16, constituted by the parallel connection of capacitor 9 and resistor 10, is not essential to the phase rotation network, but merely serves to adjust the DC voltage at control electrode 4. This is effected by capacitor 9 and resistor 10 forming an RC network which is charged by the pulsating control electrode current. Inductance coil 8 forms a short-circuit for this DC voltage.

In lieu of using capacitor 18, it is alternatively possible to use the parasitic anode-control electrode capacitance 17, provided that the latter has a suitable value. It is also possible to combine the two.

The amplitude of the voltage U in the coaxial waveguide 11 shows a sinusoidal variation with location. Because one end of this waveguide 11 is short-circuited and the other end open, the amplitude of the voltage U at the open end reaches a maximum.

The choke 5 is incorporated in the power generator to prevent the high-frequency power generated in the circuit from penetrating into the supply voltage source 6 and hereby causing damage there due to power dissipation. In addition, this choke 5 prevents the supply voltage source 6 from forming a short-circuit for the high-frequency voltage generated in the circuit. The capacitor 15 blocks a possible D.C. current path leading from the supply voltage source 6, across choke 5, the coaxial waveguide 11 short-circuited on one side, back to the supply voltage source 6. This capacitor 15 forms the anode blocking capacitance.

At point 14 there is a voltage having an amplitude $U_1$ on the inner guide 13. At the location of the short-circuit the voltage is zero. Because of the sinusoidal variation of the voltage the amplitude $U_1$ is stepped up to an amplitude $U_2$ at the open end of the coaxial waveguide 11.

If the length of the coaxial waveguide 11 corresponds to a 90° phase angle of the sinusoidal voltage, and the distance from the short-circuited end to point 14 corresponds to a° of the sinusoidal voltage, the ratio of $U_2$ to $U_1$ appears to be equal to the ratio of the 90° sine to the a° sine.

In practice, a step-up by a factor of 5 in a loaded condition appears to be readily achievable.

Figure 2:
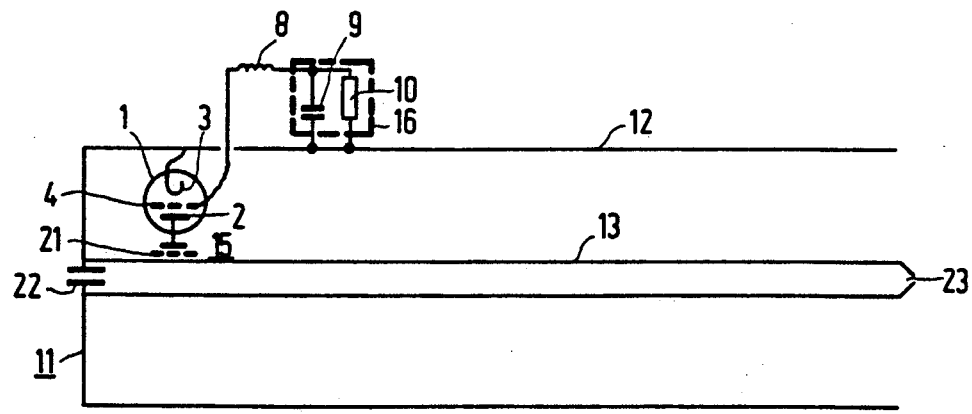
FIG. 2 shows a practical embodiment of the power generator according to the invention.

The power generator shown in FIG. 2 is a practical embodiment which comprises a coaxial waveguide 11 constituted by an outer guide 12 and a tubular inner guide 13. The power generator further includes the electron tube 1, inductance coil 8 and the auto-bias circuit 16.

In the electron tube 1 the anode 2 is connected in an electroinsulating manner to the inner guide 13 by means of the insulating plate 21. This capacitive coupling between the anode 2 and the inner guide 13 is represented in FIG. 1 by means of capacitor 15.

Insulating plate 21 is installed, for example, on a bracket (not shown in FIG. 2) around the inner guide 13. This bracket can be adjusted along the longitudinal axis of the inner guide 13 so that the location at which the AC main current path is connected to the inner guide 13 becomes adjustable.

It is likewise possible for the anode 2 to be connected in an electroinsulating fashion to inner guide 13 by means of a capacitor. In this case the capacitive coupling between the anode 2 and the inner guide 13 is realised by a real capacitor which, however, is to be resistant to the high-voltage occurring at that location.

The cathode 3 is connected to the wall of the outer guide 12, which is grounded. The control electrode 4 is connected to inductance coil 8 located outside the outer guide 12. One side of the inductance coil 8 is connected to the control electrode 4, whereas the other side is connected to one side of the auto-bias circuit 16 formed by a parallel connection of the capacitor 9 and resistor 10. The other side of the auto-bias circuit 16 is connected to the outer guide 12. In this embodiment capacitor 18 is thus completely realised by the parasitic capacitor 17.

The inner guide 13 has two openings, one, 22, at the short-circuited end of the waveguide 11 and one, 23, at the open end.

The inner guide 13 ends in a sharp point (not shown) at the open end 23 of the waveguide, which point forms part of a torch head so that a very high field strength may develop at that spot. When an operating gas flows out through the opening 23, there will be an electrical discharge at this point due to the high field strength in the operating gas so that the outflowing ionized operating gas forms a plasma flame in the high-frequency range. As a result the end of the coaxial waveguide 11 becomes a plasma torch.

As described above, the power supplied by the active element, with a given maximum supply voltage from supply voltage source 6, is adjusted by the choice of the location of point 14. When using a different operating gas and/or a different workpiece, the location of point 14 will have to be adjusted in order to be able to have the active element 1 again supply a maximum power with the given maximum supply voltage without presenting a breakdown.

If a less strong plasma flame is desired during a heating process, this can naturally be realised by reducing the supply voltage. The choice of the adjustable location of point 14 is only meant to restrict the power through active element 1 to a still permissible value with the given maximum supply voltage and at a given load.

We claim:

1. A power generator for supplying a high-frequency high-voltage comprising: an active element, a frequency-determining circuit connected in series to the AC main current path of the active element, and a control circuit connected to a control electrode of said active element, wherein the frequency-determining circuit comprises a coaxial waveguide having an electrical length of a quarter of the wavelength of the operating frequency of the power generator, one end of said waveguide being short-circuited and the other end being open, and wherein connection points of the waveguide to the AC main current path are situated in the vicinity of the short-circuited end and with at least one connection point located at an adjustable position.

2. A power generator as claimed in claim 1, wherein the inner guide includes a tube open both in the vicinity of the short-circuited end of the coaxial waveguide and at the other end.

3. A power generator as claimed in claim 2, wherein the active element includes an electron tube positioned within the coaxial waveguide, and whose anode is electrically connected to a wall of the inner guide by means of an insulating plate which forms an anode-isolating capacitance.

4. A power generator as claimed in claim 1, wherein the active element includes an electron tube located within the coaxial waveguide, and whose anode is electrically connected to a wall of the inner guide by means of an insulating plate which forms an anode-isolating capacitance.

5. A high-frequency high-voltage power oscillator comprising:
a multiple element active device having a control electrode and first and second main electrodes defining a main current path in said active device,
means for coupling said first and second main electrodes to a source of DC supply voltage,
a control circuit coupled to said control electrode and to said first and second main electrodes of said active device,
a frequency-determining circuit comprising a quarter wavelength coaxial waveguide having a short-circuited end and an open-circuited end,
means for AC coupling said coaxial waveguide to said first and second main electrodes of the active device, said AC coupling means connecting first and second connection points of the coaxial waveguide located in the vicinity of its short-circuited end to said first and second main electrodes of the active device, and wherein
at least one of said connection points is adjustable along the longitudinal axis of the coaxial waveguide.

6. A power oscillator as claimed in claim 5 wherein said coaxial waveguide includes an inner conductor and an outer conductor with said one connection point being located on the inner conductor and coupled via a capacitor to the first main electrode and the other one of said connection points being located on the outer conductor and electrically connected to ground and to the second main electrode of the active device.

7. A power oscillator as claimed in claim 6 further comprising an RC auto-bias circuit coupled to said control electrode via at least a part of the control circuit and further coupled to said second main electrode of the active device.

8. A power oscillator as claimed in claim 7 wherein the first coupling means comprises an inductor coupling the first main electrode of the active device to one terminal of the DC supply voltage.

9. A power oscillator as claimed in claim 5 wherein the electrical length of the waveguide substantially determines the operating high frequency of the power oscillator.

10. A power oscillator as claimed in claim 9 wherein the output power of the power oscillator is adjustable by adjustment of the supply voltage to the active device.

11. A power oscillator as claimed in claim 5 wherein said one connection point is chosen so as to limit the maximum power in the active device to a safe value for a given maximum supply voltage and a given oscillator load.

12. A power oscillator as claimed in claim 5 wherein said control circuit comprises a capacitance coupling the control electrode and the first main electrode of the active device and an inductance element coupling the control electrode and the second main electrode of the active device.

13. A power oscillator as claimed in claim 12 wherein said inductance element is coupled to said second main electrode via an RC auto-bias circuit which determines the DC voltage at the control electrode of the active device.

14. A power oscillator as claimed in claim 5 wherein said active device comprises an electron tube in which said first and second main electrodes comprise the anode and cathode, respectively, and said control electrode comprises the control grid.

15. A power oscillator as claimed in claim 5 wherein said coaxial waveguide includes an inner conductor and an outer conductor with said one connection point being located on the inner conductor and the other one of said connection points being located on the outer conductor, and wherein
said inner conductor includes a tube open at both ends and adapted to pass a gas from the short-circuited end to the open-circuited end, said gas being ionizable by a high-frequency high-voltage developed at the open-circuited end of the coaxial waveguide.

16. A power oscillator as claimed in claim 15 wherein the active device includes an electron tube located within the coaxial waveguide between the inner and outer conductors and having its anode capacitively coupled to a wall of the inner conductor tube and its cathode connected to an inner wall of the outer conductor of the coaxial waveguide.

17. A power oscillator as claimed in claim 16 wherein said electron tube is located within the coaxial waveguide in the vicinity of its short-circuited end.

18. A power oscillator as claimed in claim 5 wherein said coaxial waveguide includes an inner conductor and an outer conductor with said one connection point being located on the inner conductor and the other one of said connection points being located on the outer conductor and electrically connected to ground, and wherein said inner conductor includes a tube open at both ends and adapted to pass a gas, said gas being supplied to the inner conductor tube in the vicinity of the short-circuited end of the coaxial waveguide at a location of relatively low voltage of the inner conductor tube.

19. A power oscillator as claimed in claim 5 wherein said coaxial waveguide includes an inner conductor and an outer conductor with said one connection point being located on the inner conductor and the other one of said connection points being located on the outer conductor, and wherein the active device includes an electron tube located within the coaxial waveguide between the inner and outer conductors and having its anode capacitively coupled to a wall of the inner conductor and its cathode connected to an inner wall of the outer conductor of the coaxial waveguide.

* * * * *